(12) United States Patent
Moore et al.

(10) Patent No.: US 7,115,504 B2
(45) Date of Patent: Oct. 3, 2006

(54) METHOD OF FORMING ELECTRODE STRUCTURE FOR USE IN AN INTEGRATED CIRCUIT

(75) Inventors: John T. Moore, Boise, ID (US); Joseph F. Brooks, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 10/873,230

(22) Filed: Jun. 23, 2004

(65) Prior Publication Data

US 2004/0238958 A1    Dec. 2, 2004

Related U.S. Application Data

(62) Division of application No. 09/988,984, filed on Nov. 19, 2001, now Pat. No. 6,815,818.

(51) Int. Cl.
*H01L 21/44* (2006.01)

(52) U.S. Cl. ............ 438/660; 438/652; 438/653; 438/654; 438/658; 438/686; 438/666; 438/675; 257/E21.176; 257/E21.19; 257/E21.209

(58) Field of Classification Search ........ 438/652–654, 438/658, 660, 666, 675, 686; 257/E21.176, 257/E21.19, E21.209
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |

(Continued)

FOREIGN PATENT DOCUMENTS

DE    4238080    5/1993

(Continued)

OTHER PUBLICATIONS

Abdel-All, A.; Elshafle,A.; Elhawary, M.M., DC electric-field effect in bulk and thin-film Ge5As38Te57 chalcogenide glass, Vacuum 59 (2000) 845-853.

(Continued)

*Primary Examiner*—George Fourson
*Assistant Examiner*—Thanh V. Pham
(74) *Attorney, Agent, or Firm*—Dickstein Shapiro LLP

(57) ABSTRACT

An electrode structure includes a first layer of conductive material and a dielectric layer formed on a surface of the first layer. An opening is formed in the dielectric layer to expose a portion of the surface of the first layer. A binding layer is formed on the dielectric layer and on the exposed portion of the surface of the first layer and a second layer of conductive material is formed on the conductive binding layer. The binding layer can be an oxide and the second layer a conductive material that is diffusible into an oxide. The electrode structure can be annealed to cause conductive material from the second layer to be chemisorbed into the binding layer to improve adhesion between the first and second layers. A programmable cell can be formed by forming a doped glass layer in the electrode structure.

14 Claims, 9 Drawing Sheets

U.S. PATENT DOCUMENTS

| | | |
|---|---|---|
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,837,564 A | 11/1998 | Sandhu et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,184,477 B1 | 2/2001 | Tanahashi |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowery et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,642,102 B1 | 11/2003 | Xu |

| | | |
|---|---|---|
| 6,646,297 B1 | 11/2003 | Dennison |
| 6,649,928 B1 | 11/2003 | Dennison |
| 6,667,900 B1 | 12/2003 | Lowery et al. |
| 6,671,710 B1 | 12/2003 | Ovshinsky et al. |
| 6,673,648 B1 | 1/2004 | Lowery |
| 6,673,700 B1 | 1/2004 | Dennison et al. |
| 6,674,115 B1 | 1/2004 | Hudgens et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 2001/0002046 A1 | 5/2001 | Reinberg et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0145200 A1* | 10/2002 | Dalton et al. ............... 257/762 |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| EP | 0310108 | 4/1989 |
| EP | 0501120 | 9/1997 |
| EP | 0807967 | 11/1997 |
| EP | 0973195 | 1/2000 |
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |
| WO | WO 02/37572 A1 | 5/2002 |
| WO | WO 03/052815 A2 | 6/2003 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.;Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N; Parthasarathy, G.; Gopal, E.S.R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid State Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin Solid Films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-721.

Boolchand, P.; Bresser, W.J., Mobile silver ions and glass formation in solid electrolytes, Nature 410 (2001) 1070-1073.

Boolchand, P.; Georgiev, D.G.; Goodman, B., Discover of the Intermediate Phase in Chalcogenide Glasses, J. Optoelectronics and Advanced Materials, 3 (2001), 703, 51 pages.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amporphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grotaus, J.; Phillips, J.C., Broken chemical order and phase separation in GexSe1-x glasses, Solid State Comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030, 15 pages.

Boolchand, P.; Grothaus, J, Molecular Stucture of Melt-Quenched GeSe2 and GeS2 glasses compared, Proc. Int. Conf. Phys. Semicond. (Eds. Chadi and Harrison) $17^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, electric field induced creation of stable devices in CuIneSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2° to 300°K, J. Appl. Phys. 38 (1967) 753-756.

Davis, E.A., Semiconductors without form, Search 1 (1970) 152-155.

Dearnaly, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992) 259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliot, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X.; Bresser, W.J.; Boolchand, P., Direct evidence for stiffness threshold in chalcogenide glasses, Phys. Rev. Lett. 78 (1997) 4422-4425.

Feng, X,; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP (2 pages).

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Crst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title pp. 114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2762-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductorsystems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/P+a-Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se5 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-441.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliot, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic conductivity of $Ag_x(GeSe_3)_{1-x}$ ($0<=x<=0.571$) glasses, Solid State Ionics 123 (1999) 259-269.

Kluge, G.; Thomas, A.; Klabes, R.; Grotzschel, R.; Suptitz, P.; Silver photodiffusion in amorphous GexSe 100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin, R.E., Chalcogenide glass polarization and the type of contacts, J. Non-Cryst. Solids 194, (1996) 256-259.

Kotkata, M.F.; Afifi, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologis Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 5/6, 2000; pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Kumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of Pure & Appl. Phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185—C2-188.

McHardy et al., The dissolution of metals in amorphous chalcogenides and the effects of electron and ultraviolet radiation, 20 J. Phys. C.: Solid State Phys., pp. 4055-4075 (1987).

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcohalides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3852.

Miyatani, S.-y., Electronic and ionic conduction in $(Ag_xCu_{1-x})_2Se$, J. Phys. Soc. Japan 34 (1973) 423-432.

Miyatani, S.-y., Electrical properties of Ag2Se, J. Phys. Soc. Japan 13 (1958) 317.

Miyatani, S,-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transition in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical properties of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Metalurgical Transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-State Electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and theshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electical switching in germanium telluride glasses doped with Cu and Ag, Appl. Phys. A 69 (1999) 421-425.

Rose,M.J;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a-Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma,A.K.; Singh, B., Electrical conductivity measurements of evaporated selenium films in vacuum, Proc. Indian Natn. Sci. Acad. 46, A, (1980) 362-368.

Sharma, R.P., Structural, electrical and optical properties of silver selenide films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue memory effects in metal/a-Si:H/metal memory devices, J. Non-Cryst. Solids 137-138 (1991) 1257-1262.

Snell, A.J.; Hajto, J.; Rose, M.J.; Osborne, I.S.; Holmes, A.; Owen, A.E.; Gibson, R.A.G., Analogue memory effects in metal/a-Si:H/metal thin film structures, Mat. Res. Soc. Symp. Proc. V 297, (1993), 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant, S.; Peytavin, S.; Ribes,M.;Flank, A.M.;Dexpert,H.; Lagarde,J.P., Silver chalcogenide glasses Ag-Ge-Se: Ionic conduction and exafs structural investigation, Transport-structure relations in fast ion and mixed conductors Proceedings of the 6th Riso International Symposium. Sep. 9-13, 1985, pp. 425-430.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1979) 267-272.

Vodenicharov, C.; Paravanov, S.; Petkov, P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance metal/silicide antifuse, IEEE Electron Dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998, 189 pages.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Marc A. Kastner—"Artificial Atoms," Physics Today, Jan. 1993, pp. 24-31.

K. Ismail et al.—"Electron resonant tunneling in Si/SiGe double barrier diodes," Applied Physics Letters, vol. 59, No. 8, Aug. 19, 1991, pp. 973-975.

Sean L. Rommel, et al.—"Room temperature operation of epitaxially grown $Si/Si_{0.5}Ge_{0.5}/Si$ resonant interband tunneling diodes," Applied Physics Letters, vol. 73, No. 15, Oct. 12, 1998, pp. 2191-2193.

* cited by examiner

METHOD OF FORMING ELECTRODE STRUCTURE FOR USE IN AN INTEGRATED CIRCUIT

This application is a divisional of U.S. patent application Ser. No. 09/988,984, filed Nov. 19, 2001 now U.S. Pat. No. 6,815,818, which is herein incorporated by reference.

FIELD OF THE INVENTION

The present invention relates generally to semiconductor chips and integrated circuits, and more particularly to an electrode structure for use in integrated circuits, such as electronic systems, memory systems and the like.

BACKGROUND OF THE INVENTION

In fabricating integrated circuits, semiconductor chips and the like, chemical/mechanical planarization can be used as an intermediate operation to planarize a structure to provide a uniform, level surface for subsequent processing operations in the manufacturing of a semiconductor chip or integrated circuit. For example, electrodes or electrical contacts between different layers of conductive materials in a semiconductor chip can be formed by depositing a first layer of conductive material, typically a metal, although a semiconductor material could be used as well, and then depositing a thin dielectric layer over the first conductive layer. The dielectric layer is then patterned to form at least one opening in the dielectric layer to expose a portion of the surface of the first conductive layer. The opening can have a small aspect ratio of depth to width. For instance, the opening can be about half a micron wide but only about 500 angstroms deep thus presenting a aspect ratio of about 0.1. A second layer of a different conductive material is then deposited on the dielectric layer and in the opening on the first conductive layer to make electrical contact through the opening with the first conductive layer. The second conductive layer is then removed form the dielectric layer or planarized to expose the dielectric layer and to form an isolated electrode or damascene contact structure in the opening before subsequent fabrication operations. In removing the second conductive layer by chemical/mechanical processing or planarization (CMP), the forces created by the CMP process can have a tendency to force the conductive material of the second layer out of the opening thereby destroying the contact.

Accordingly, for the reason stated above, and for other reasons that will become apparent upon reading and understanding the present specification, there is a need for an electrode structure and method of fabrication that provides substantially improved adhesion between a first layer of conductive material and second layer of a different conductive material, particularly during a CMP operation, and that does not adversely effect the conductivity between the two layers or create an electrical barrier. There is also a need for a method of fabricating an electrode structure that does not effect or damage other components that may already have been formed on the same wafer or substrate and that does not adversely effect the manufacturing process by requiring a significant number of additional process operations.

SUMMARY OF THE INVENTION

The above mentioned problems with electrode structures are addressed by the present invention and will be understood by reading and studying the following specification. Electrode structures, memory cells and systems are provided by the present invention that exhibit good adhesion between different conductive layers during manufacturing operations such as CMP without the conductivity between the layers being adversely effected. Methods of fabricating are also provided by the present invention that do not adversely effect other components that may have already been formed on a semiconductor die.

In accordance with the present invention, an electrode structure includes a first layer of conductive material and a dielectric layer formed on a surface of the first layer. An opening is formed in the dielectric layer to expose a portion of the surface of the first layer. A binding layer is formed on the dielectric layer and on the exposed portion of the surface of the first layer and a second layer of conductive material is formed on the conductive binding layer.

In accordance with an embodiment of the present invention, a memory cell, includes a first layer of conductive material and a dielectric layer formed on a surface of the first layer. An opening is formed in the dielectric layer to expose a portion of the surface of the first layer. A binding layer is formed on the dielectric layer and on the exposed portion of the surface of the first layer and a second layer of conductive material is formed on the binding layer. A layer of doped chalcogenide material is formed on the second layer of conductive material and a third layer of conductive material is formed on the layer of doped chalcogenide material.

In accordance with another embodiment of the present invention, a method of making an electrode, comprises: forming a first layer of conductive material; forming a dielectric layer on a surface of the first layer; forming an opening in the dielectric layer to expose a portion of the surface of the first layer; forming a binding layer on the dielectric layer and on the exposed portion of the surface of the first layer; and forming a second layer of conductive material on the binding layer. The electrode structure can be annealed at a selected temperature for a predetermined time period to cause conductive material from the second layer to be diffused into the binding layer to improve adhesion and conductivity between the first and second conductive layers.

In accordance with another embodiment of the present invention, a method of making a memory cell, comprises: forming a first layer of conductive material; forming a dielectric layer on a surface of the first layer; forming an opening in the dielectric layer to expose a portion of the surface of the first layer; forming a binding layer on the dielectric layer and on the exposed portion of the surface of the first layer; forming a second layer of conductive material on the binding layer; forming a layer of doped chalcogenide material on the second layer of conductive material; and forming a third layer of conductive material on the layer of doped chalcogenide material. The layer of chalcogenide material can be doped by annealing the memory cell to cause conductive material from the third layer to be chemisorbed into the chalcogenide layer.

These and other embodiments, aspects, advantages and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the drawings, like numerals describe substantially similar components throughout the several views. Like numerals having different letter suffixes or primed (X') represent different occurrences of substantially similar components.

DESCRIPTION OF THE EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments can be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process operations may have been utilized to form regions/junctions in the base semiconductor structure. The following detailed description is, therefore, not to be taken in a limiting sense, and the scope of the present invention is defined only by the appended claims.

The transistors described herein include transistors from bipolar-junction technology (BJT), field effect technology (FET), or complimentary metal-oxide-semiconductor (CMOS) technology. A metal-oxide-semiconductor (MOS) transistor includes a gate, a first node (drain) and a second node (source). Since a MOS transistor is typically a symmetrical device, the true designation of "source" and "drain" is only possible once voltage is impressed on the terminals. The designations of source and drain herein should be interpreted, therefore, in the broadest sense. It should also be noted that a P-channel MOS transistor could alternatively be used for an N-channel MOS transistor and vice versa with the polarity of the associated gate voltages merely being reversed. For example, applying a negative gate voltage in the situation of a P-channel MOS transistor to activate the transistor and reversing the polarity to apply a positive gate voltage to activate an N-channel transistor if an N-channel MOS transistor is substituted for a P-channel transistor.

Figure 1A:
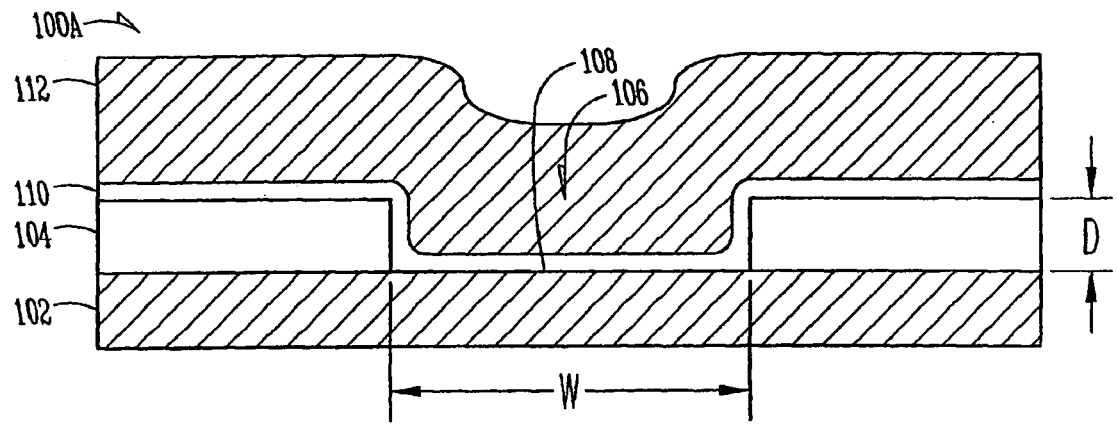
FIGS. 1A–1C illustrate the operations in forming an electrode for use in an integrated circuit in accordance with the present invention.
Figure 1B:
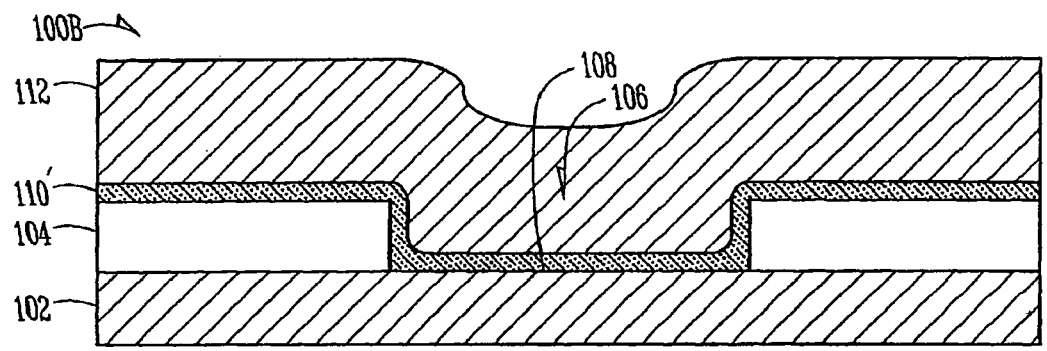
Figure 1C:
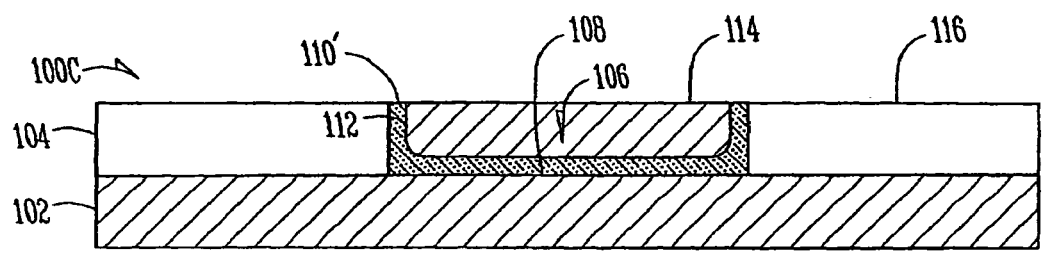

FIGS. 1A–1C illustrate the operations in forming an electrode structure 100 in accordance with the present invention. In FIG. 1A, a first layer 102 of conductive material is deposited or formed. The first layer 102 of conductive material can be tungsten, nickel or a semiconductor material. A dielectric layer 104 is formed on the first conductive layer 102. The dielectric layer 104 can be a nitride, such as silicon nitride or a similar dielectric material. The dielectric layer 104 is patterned by standard photolithographic techniques or the like to form at least one opening 106 through the dielectric layer 104 to expose a portion of a surface 108 of the first conductive layer 102. The opening 106 can have a width "W" or a diameter that is significantly larger than a depth "D" to provide a small aspect ratio; however, the invention is not limited to such aspect ratios. A layer 110 of oxide is formed on the dielectric layer 104 and on the surface 108 of the first conductive layer 102. The oxide layer 110 can be a silicon oxide deposited by the thermal reaction of a precursor, such as tetraethyl orthosilicate (TEOS) or the like. The oxide layer 110 can have a thickness between about 50 angstroms and about 200 angstroms. A second layer 112 of conductive material is formed on the oxide layer 110. The second layer 112 of conductive material can be silver, nickel or another metal or conductive material that can diffuse into the oxide layer 110 and bond to the oxide layer 110.

In FIG. 1B, the electrode structure 100B is annealed in an inert ambient environment at a selected temperature for a predetermined time period. The inert ambient environment can be nitrogen, argon or some other gas that is non-reactive to the materials forming the electrode structure 100. For an oxide layer 110 of TEOS and a second conductive layer 112 of silver, annealing at about 350° Celsius for about ten minutes provides the proper amount of diffusion or chemisorption of silver molecules into the TEOS to make the oxide layer 110 at least semiconductive so as to not create an electrical barrier between the first and second conductive layers 102 and 112. The oxide layer 110 is therefore converted into a conductive or at least semiconductive binding layer 110' by the annealing operation. The electrode structure 100B can be annealed at temperatures as low as about 130° Celsius or room temperature; however, the time period to achieve the proper level of chemisorption will be much longer thereby increasing the amount of time overall for the manufacturing process. According to the present invention, the annealing temperature and time period can be adjusted to control the rate and amount of diffusion or chemisorption of molecules of the conductive material or metal from the second layer 112 into the oxide layer 110. The annealing temperature and time period are also selected with consideration of other components and subsequent processing steps so as to not adversely effect or damage other components that have already been formed on a wafer or semiconductor die or that would result in additional processing operations that would increase the cost and time to manufacture a semiconductor chip.

In FIG. 1C, the electrode structure can be planarized to form an isolated electrode structure or damascene layer 114 and to form a level or more uniform surface 116 for subsequent processing operations. The planarization of the electrode structure 100C can be accomplished by a chemical/mechanical planarization (CMP) process or the like. In accordance with the present invention, the binding layer 110' is selected to provide sufficient adhesion between the first and second conductive layers 102 and 112 to prevent the forces created by the CMP process from forcing or warping out the damascene layer 114.

Figure 2A:
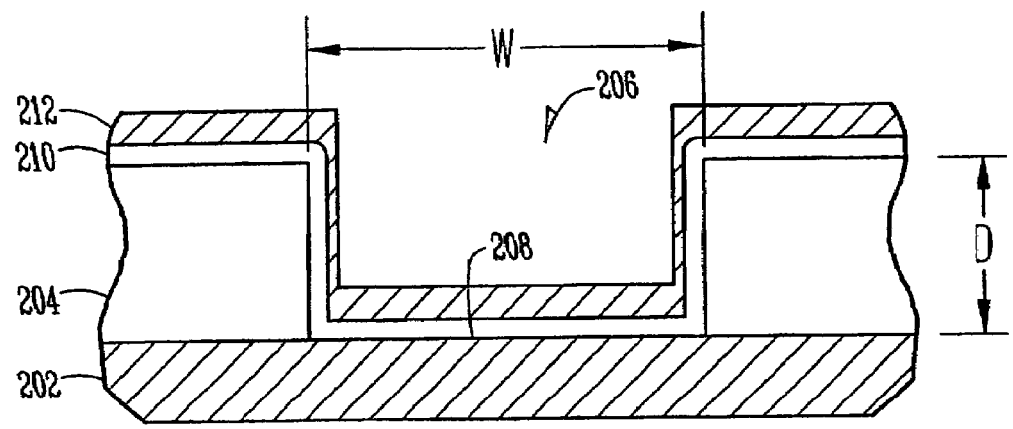
FIGS. 2A–D illustrate the operations in forming a programmable memory cell in accordance with an embodiment of the present invention.

In FIGS. 2A–2D, the process operations are shown to form a programmable memory or metallization cell structure 200 in accordance with an embodiment of the present invention that can be used in a memory system, such as a programmable cell random access memory (PCRAM) device or the like. In FIG. 2A, a first conductive layer 202 is formed. The first conductive layer 202 can be a metal, such as tungsten, nickel or the like, or the first conductive layer 202 can be a semiconductor or polysilicon material. A layer 204 of dielectric material is formed on the first conductive layer 202. The dielectric layer 204 can be a nitride, for example silicon nitride or a similar dielectric. The dielectric layer 204 is selectively patterned by standard photolithographic techniques or similar material removal techniques to form at least one opening 206 in the dielectric layer 204 and to expose a portion of a surface 208 of the first conductive layer 202. The opening 206 can have a depth dimension "D" that is much smaller than a width dimension "W" to define a small aspect ratio of depth to width. The invention, however, is not so limited. A layer 210 of oxide is formed on the dielectric layer 204 and on the exposed surface portion 208 of the first conductive layer 202. The oxide layer 210 can be a silicon dioxide. The oxide layer 210 can have a thickness between about 50 angstroms and about 100 angstroms. A second layer 212 of conductive material is formed on the oxide layer 210 and in the opening 206. The second conductive layer 212 can be a metal, such as silver, nickel, polysilicon or other conductive material that is diffusible into an oxide and exhibits good adhesion to an oxide. The second conductive layer can have a thickness between about 50 angstroms and about 500 angstroms depending upon other parameters or features of the memory cell structure 200.

Figure 2B:
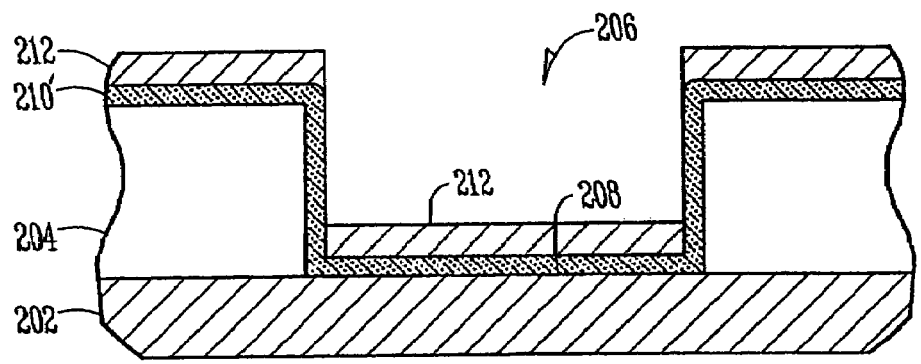

In FIG. 2B, the memory cell structure 200B is annealed at a selected temperature for a predetermined time period in an inert ambient environment, such as nitrogen, argon or some other gas that is non-reactive to the materials forming the cell structure 200. As an example, for an oxide layer 210 of TEOS and a second conductive layer 212 of silver, annealing at about 350° Celsius for about 10 minutes provides the appropriate level of diffusion or chemisorption of silver molecules into the TEOS oxide layer 210 to make the oxide layer 210 at least semiconductive so as to not create an electrical barrier between the first and second conductive layers 202 and 212. The oxide layer 210 becomes a conductive or semiconductive binding layer 210' as a result of the annealing operation and provides stronger adhesion between the first and second conductive layers 202 and 212 as a result of the annealing process for stability of the structure 200 during subsequent manufacturing operations such as CMP. As one of ordinary skill in the art will understand by reading and comprehending this disclosure, the annealing temperature and time can be adjusted to control the rate and amount of chemisorption of silver or conductive material from the second conductive layer 212 into the oxide layer 210 and to also control the impact on previously formed structures or devices on the wafer or semiconductor chip. Because of the diffusion of conductive material during the annealing process, the resulting conductive binding layer 210' defines an electrical contact or interface between the first and second conductive layers 202 and 212.

Figure 2C:
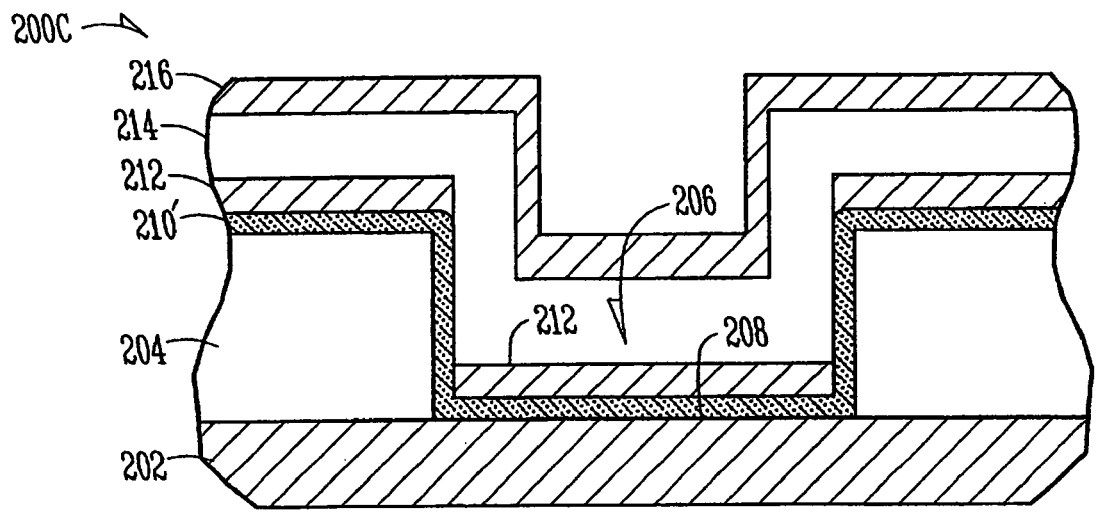

In FIG. 2C, a layer 214 of chalcogenide glass material is formed on the on the second conductive layer 212 and in the opening 206. The layer 214 of chalcogenide glass material can be germanium selenide ($Ge_XSe_{1-X}$, where X is the concentration of germanium and 1–X is the concentration of selenide). In one embodiment according to the teachings of the present invention, the concentration ratio of germanium to selenide can be between about 15/85 and about 40/60. A third layer 216 of conductive material is formed on the layer 214. The third conductive layer 216 can be a metal such as silver, nickel or another metal that is diffusible into a chalcogenide material. The layer 214 is doped by annealing the memory cell structure 200C to cause metal or conductive material from the third layer 216 to diffuse into the chalcogenide layer 214 to a selected concentration. The annealing process can be ultra violet annealing or a similar annealing process. The annealing process also improves adhesion between the third conductive layer 216 and the chalcogenide layer 214 resulting in a highly adhesive cell structure 200C that can withstand the forces or pressures applied by subsequent manufacturing operations such as CMP.

Figure 2D:
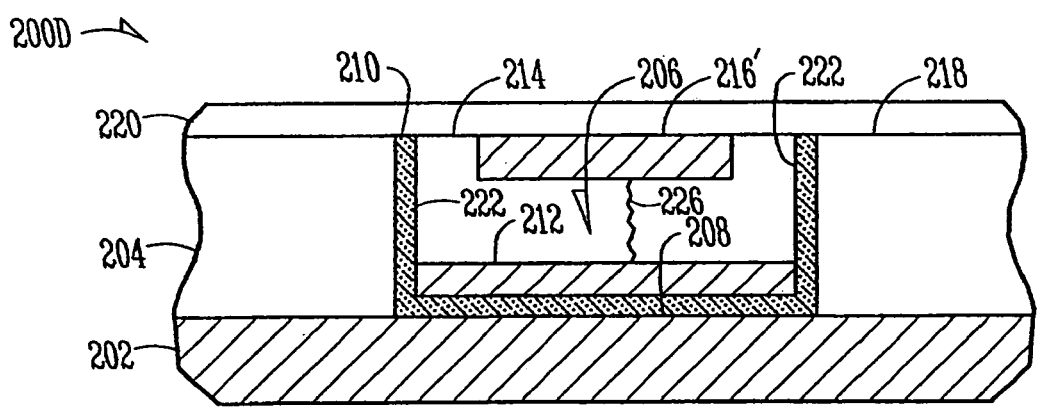

In FIG. 2D, the cell structure 200D is planarized to form an isolated cell structure 200D or third layer contact or damascene layer 216' and to provide a level or more uniform surface 218 for subsequent processing operations. The cell structure 200D can be planarized by CMP or the like. A fourth layer 220 of conductive material can be formed on the planarized surface 218 and in electrical contact with the third layer contact 216'.

The conductive material or metallization of the second layer 212 formed on the sidewalls 222 of the opening 206 can be minimized by the deposition process and is substantially diffused into the oxide layer 210 on the sidewalls 222 during the annealing process. In this manner, no isolation or dielectric is required between any residual metallization on the sidewalls 222 and the fourth layer of conductive material 220 that would necessitate additional process steps after the CMP operation and before the fourth layer 220 is formed.

Figure 3A:
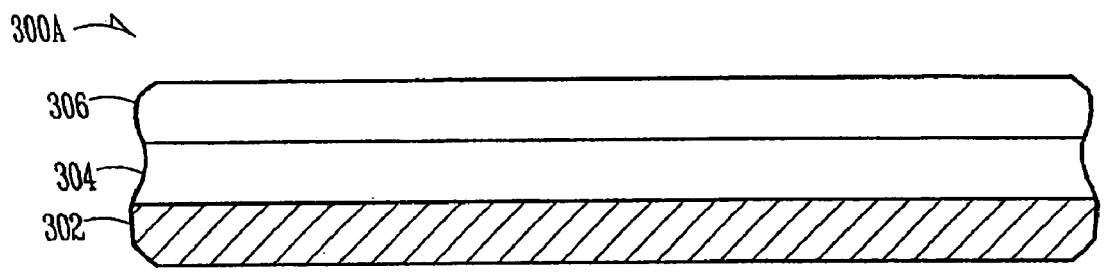
FIGS. 3A–3E illustrate the operations in forming a programmable memory cell in accordance with another embodiment of the present invention.
Figure 3B:
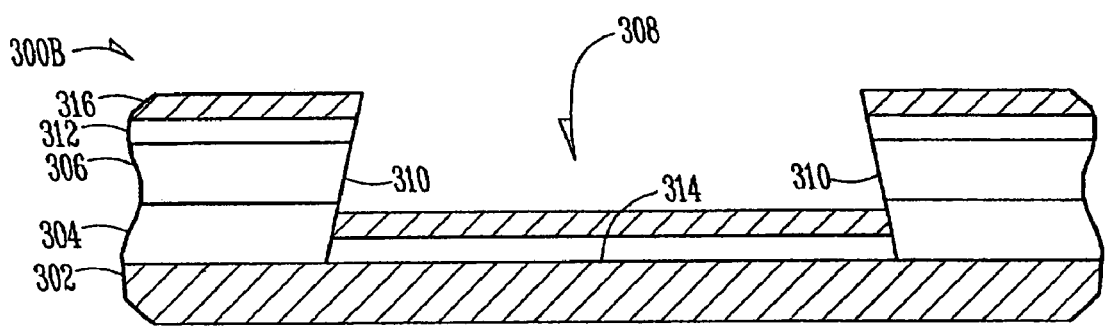

FIGS. 3A–3E illustrate the operations in forming a programmable memory cell 300 in accordance with another embodiment of the present invention that forms a reentrant profile to prevent conductive material from forming on the sidewalls of the opening in the dielectric layer. In FIG. 3A, a first conductive layer 302 is formed. The first conductive layer 302 can be a metal such as tungsten, nickel, or the like, or a semiconductor material or polysilicon. A first dielectric layer 304 having one etch rate is formed on the first conductive layer 302 and a second dielectric layer 306 having a second etch rate is formed on the first dielectric layer 304. In accordance with the present invention, the etch rate of the first dielectric layer 304 is faster than the etch rate of the second dielectric layer 306. Accordingly, in FIG. 2B, when the first and second dielectric layers 304 and 306 are selectively patterned to form an opening 308, the opening has a reentrant profile with sidewalls 310 that angle back as the opening 308 extends down to expose the first conductive layer 302. A layer 312 of oxide is formed on the second dielectric layer 306 and on an exposed surface portion 314 of the first conductive layer 302 in the opening 308. The oxide layer 312 can be a silicon oxide. A second layer 316 of conductive material is formed on the oxide layer 312. The second conductive layer 316 can be silver, nickel or another conductive material or metal that is diffusible into an oxide. Because of the reentrant profile of the opening 308, the second conductive layer 316 and oxide layer 312 cannot form on the sidewalls 310 of the opening 308.

Figure 3C:
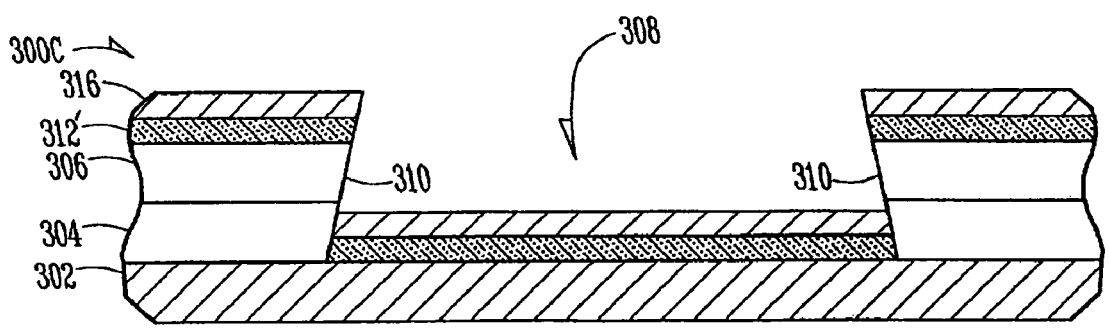

In FIG. 3C, the cell structure 300C is annealed at a selected temperature for a predetermined time period to cause metallization or conductive material from the second conductive layer 316 to diffuse into the oxide layer 312 to form a conductive binding layer 312'. The conductive binding layer 312' provides electrical contact and adhesion between the first and second conductive layers 302 and 316 during subsequent processing operations such as CMP. As previously discussed, the annealing temperature and time can be adjusted to control the amount of chemisorption of metal molecules into the oxide layer 312 and to control the impact on other components or devices already formed on the wafer or semiconductor chip.

Figure 3D:
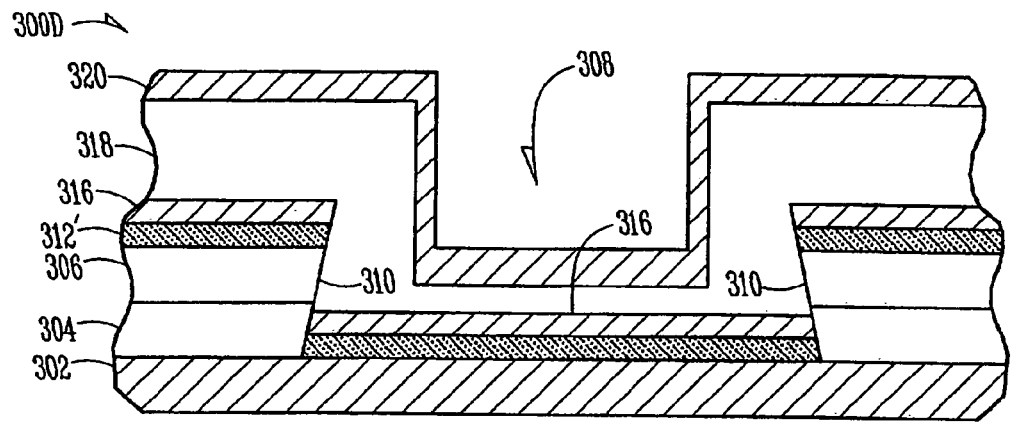

In FIG. 3D, a layer 318 of chalcogenide glass material is formed on the on the second conductive layer 316 and in the opening 308. The layer 318 of chalcogenide glass material can be germanium selenide ($Ge_XSe_{1-X}$, where X is the concentration of germanium and 1–X is the concentration of selenide). As previously discussed, according to the teachings of the present invention, the concentration ratio of germanium to selenide can be between about 15/85. and about 40/60. A third layer 320 of conductive material is formed on the layer 318. The third conductive layer 318 can be a metal such as silver, nickel or another metal that is diffusible into a chalcogenide material. The layer 318 is doped by annealing the memory cell structure 300D to cause metal or conductive material from the third layer 320 to diffuse into the chalcogenide layer 318 to bond the two layers together and provide better adhesion.

Figure 3E:
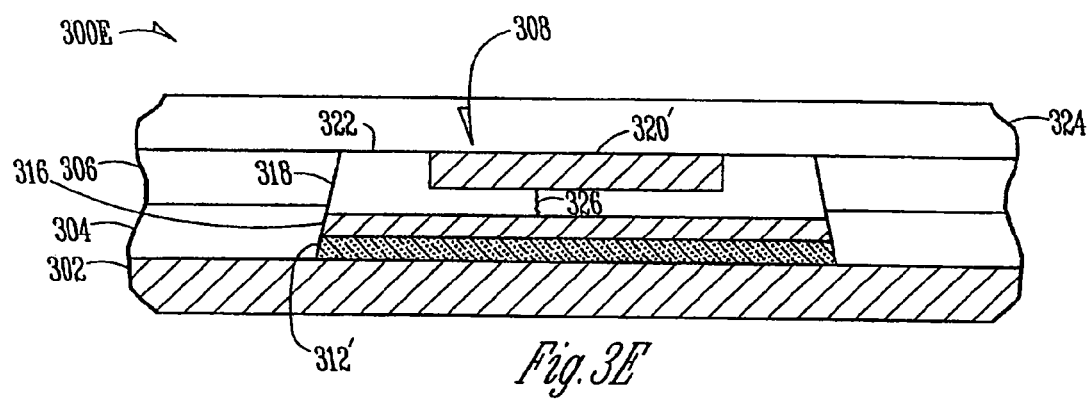

In FIG. 3E, the cell structure 300E is planarized to form an isolated cell structure 300E including an isolated third layer contact or electrode 320'. The planarization also provides a level, more uniform surface 322 for subsequent processing operations. The cell structure 300E can be planarized by CMP or the like. A fourth layer 324 of conductive material can be formed on the planarized surface 322 and in electrical contact with the third layer electrode or contact 320'.

In operation, the programmable memory cell 200 or 300 or programmable metallization cell can be programmed by applying a potential or voltage across the first layer or electrode 302 and the third layer electrode 320' that has a sufficient voltage level to cause a dendrite 326 or conductive filament to be formed between the electrode 320' and the second conductive layer 316 which is electrically connected to the first layer electrode 302 by the conductive binding layer 312'. Because the chalcogenide layer 322 is doped with a metal or conductive material such as silver, the voltage causes the dendrite 326 (226 in FIG. 2D) to be formed to short circuit the two electrodes 320' and 302. The resistance across a cell 300 that has been biased by applying sufficient voltage to form the dendrite 326 is about 10,000 ohms. The resistance of a cell 300 that has not been biased and is in an open condition is about 10 megohms. Accordingly, a programmed cell 300 to which a voltage has been applied to form the dendrite 326 can represent a logic 1 and an unprogrammed or open cell 300 can represent a logic 0. To erase a programmed cell 300, a reverse polarity voltage can be applied to the electrodes 320' and 302 of the cell 300 to cause sufficient current to flow through the cell 300 to return the cell 300 to a high resistance state by destruction of the dendrite 326 or conductive element.

Figure 4:
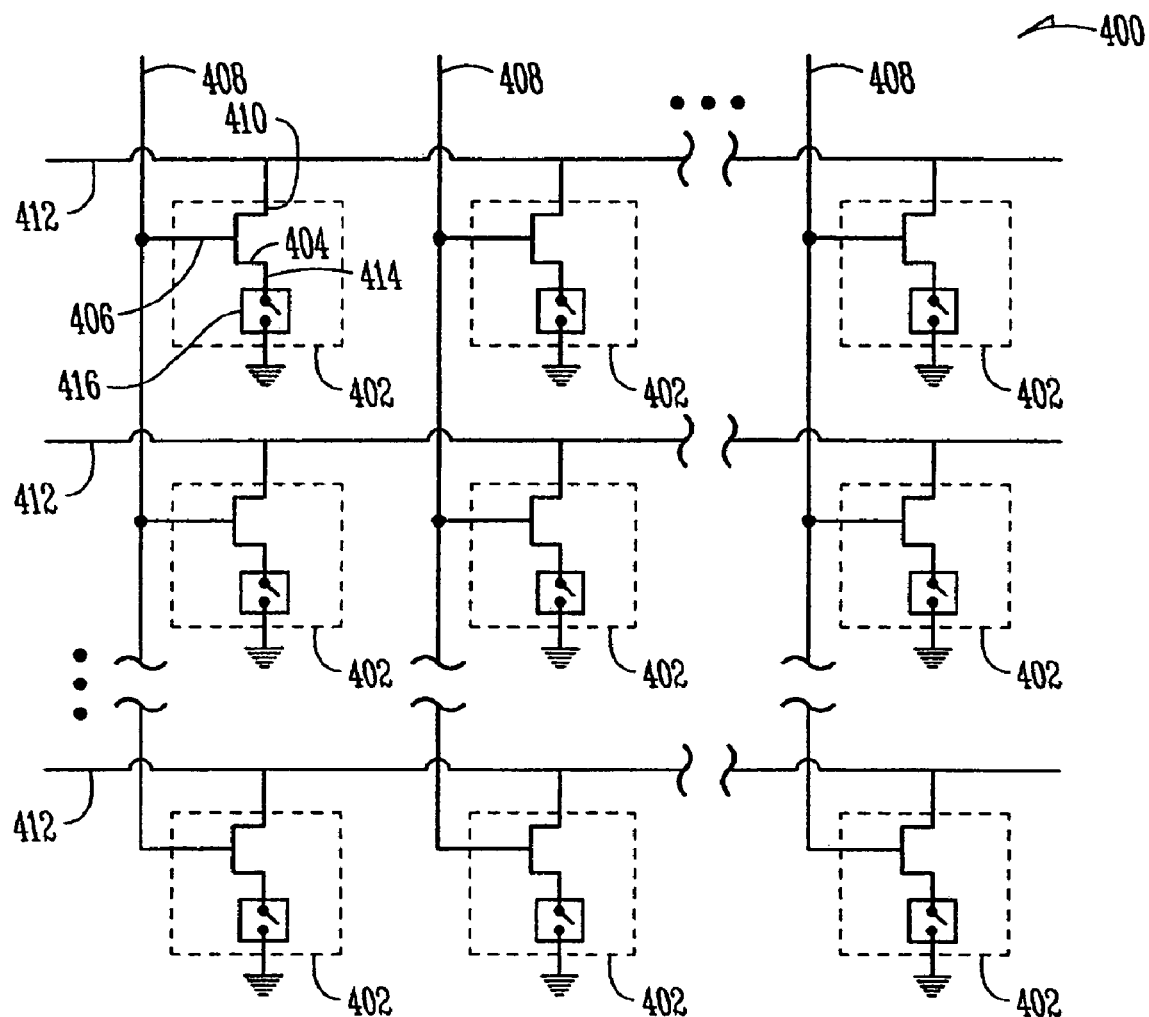
FIG. 4 is a schematic diagram of a memory system incorporating a programmable memory cell in accordance with the present invention.

FIG. 4 is a schematic diagram of a memory device or system 400 in accordance with the present invention. The memory system 400 includes a plurality of memory elements 402 that can be arranged in rows and columns. Each memory element 402 can include a transistor 404. Each transistor 404 includes a gate electrode 406 coupled to an address line 408 for controlling the operation of the memory element 402, and each transistor 404 includes a first source/drain electrode 410 coupled to a data line 412 and a second source/drain electrode 414 coupled to a programable memory cell 416 according to the teachings of the present invention, e.g. similar to the memory cells 200D (FIG. 2D) and 300E (FIG. 3E).

Figure 5:
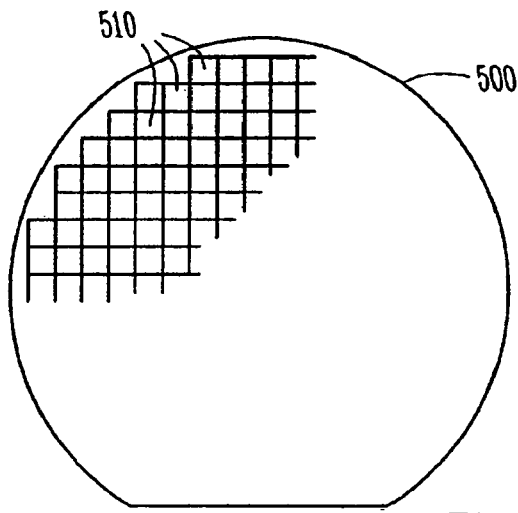
FIG. 5 is a top view of a wafer or substrate containing semiconductor dies in accordance with an embodiment of the present invention.

With reference to FIG. 5, a semiconductor die 510 can be produced from a silicon wafer 500 that can contain a memory system similar to system 400 or an electronic system including the novel electrode structure 100C (FIG. 1E) or memory cells 200D (FIG. 2D) or 300E (FIG. 3E) in accordance with the present invention. A die 510 is an individual pattern, typically rectangular, on a substrate that contains circuitry to perform a specific function. A semiconductor wafer 500 will typically contain a repeated pattern of such dies 510 containing the same functionality. Die 510 can further contain additional circuitry to extend to such complex devices as a monolithic processor with multiple functionality. Die 510 is typically packaged in a protective casing (not shown) with leads extending therefrom (not shown) providing access to the circuitry of the die 510 for unilateral or bilateral communication and control.

Figure 6:
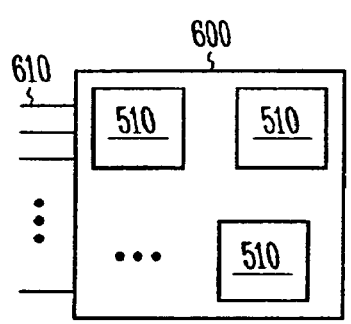
FIG. 6 is a block schematic diagram of a circuit module in accordance with an embodiment of the present invention.

As shown in FIG. 6, two or more dies 510, including at least one electronic system or memory system 400 that incorporates the novel electrode structure 100C or memory cells 200D or 300E in accordance with the present invention, can be combined, with or without a protective casing, into a circuit module 600 to enhance or extend the functionality of an individual die 510. Circuit module 600 can be a combination of dies 510 representing a variety of functions, or a combination of dies 510 containing the same functionality. Some examples of a circuit module 600 include memory modules, device drivers, power modules, communication modems, processor modules and application-specific modules and can include multi-layer, multi-chip modules. Circuit module 600 can be a sub-component of a variety of electronic systems, such as a clock, a television, a cell phone, a personal computer, an automobile, an industrial control system, an aircraft and others. Circuit module 600 will have a variety of leads 610 extending therefrom providing unilateral or bilateral communication and control.

Figure 7:
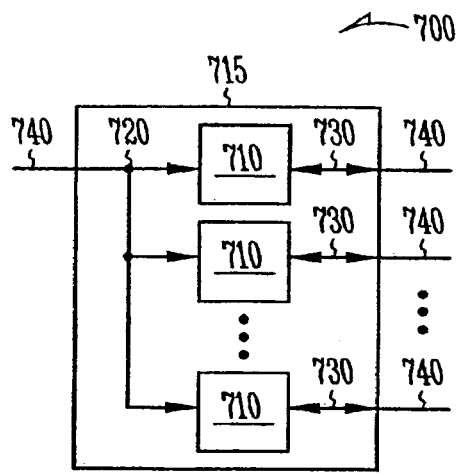
FIG. 7 is a block schematic diagram of a memory module in accordance with an embodiment of the present invention.

FIG. 7 shows one embodiment of a circuit module as a memory module 700 containing circuitry for the memory system 400 including the electrode structure 100C or memory cell structures 200D or 300E of the present invention. Memory module 700 generally depicts a Single In-line Memory Module (SIMM) or Dual In-line Memory Module (DIMM). A SIMM or DIMM can generally be a printed circuit board (PCB) or other support containing a series of memory devices. While a SIMM will have a single in-line set of contacts or leads, a DIMM will have a set of leads on each side of the support with each set representing separate I/O signals. Memory module 700 contains multiple memory devices 710 contained on support 715, the number depending upon the desired bus width and the desire for parity. Memory module 700 can contain memory devices 710 on both sides of support 715. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions shown in FIG. 7.

Figure 8:
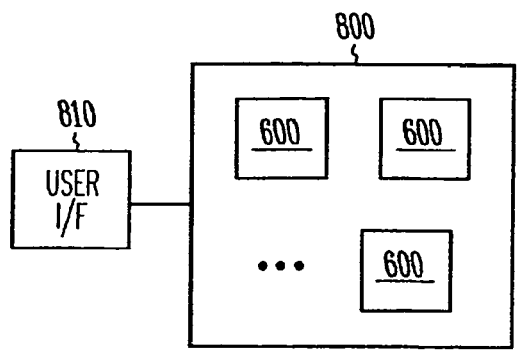
FIG. 8 is a block schematic diagram of an electronic system in accordance with another embodiment the present invention.

FIG. 8 shows an electronic system 800 containing one or more circuit modules 600 as described above containing the novel memory system 400 and electrode structure 100C or memory cells 200D or 300E of the present invention. Electronic system 800 generally contains a user interface 810. User interface 810 provides a user of the electronic system 800 with some form of control or observation of the results of the electronic system 800. Some examples of user interface 810 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 810 can further describe access ports provided to electronic system 800. Access ports are used to connect an electronic system to the more tangible user interface components previously exemplified. One or more of the circuit modules 600 can be a processor providing some form of manipulation, control or direction of inputs from or outputs to user interface 810, or of other information either preprogrammed into, or otherwise provided to, electronic system 800. As will be apparent from the lists of examples previously given, electronic system 800 will often contain certain mechanical components (not shown) in addition to the circuit modules 600 and user interface 810. It will be appreciated that the one or more circuit modules 600 in electronic system 800 can be replaced by a single integrated circuit. Furthermore, electronic system 800 can be a sub-component of a larger electronic system.

Figure 9:
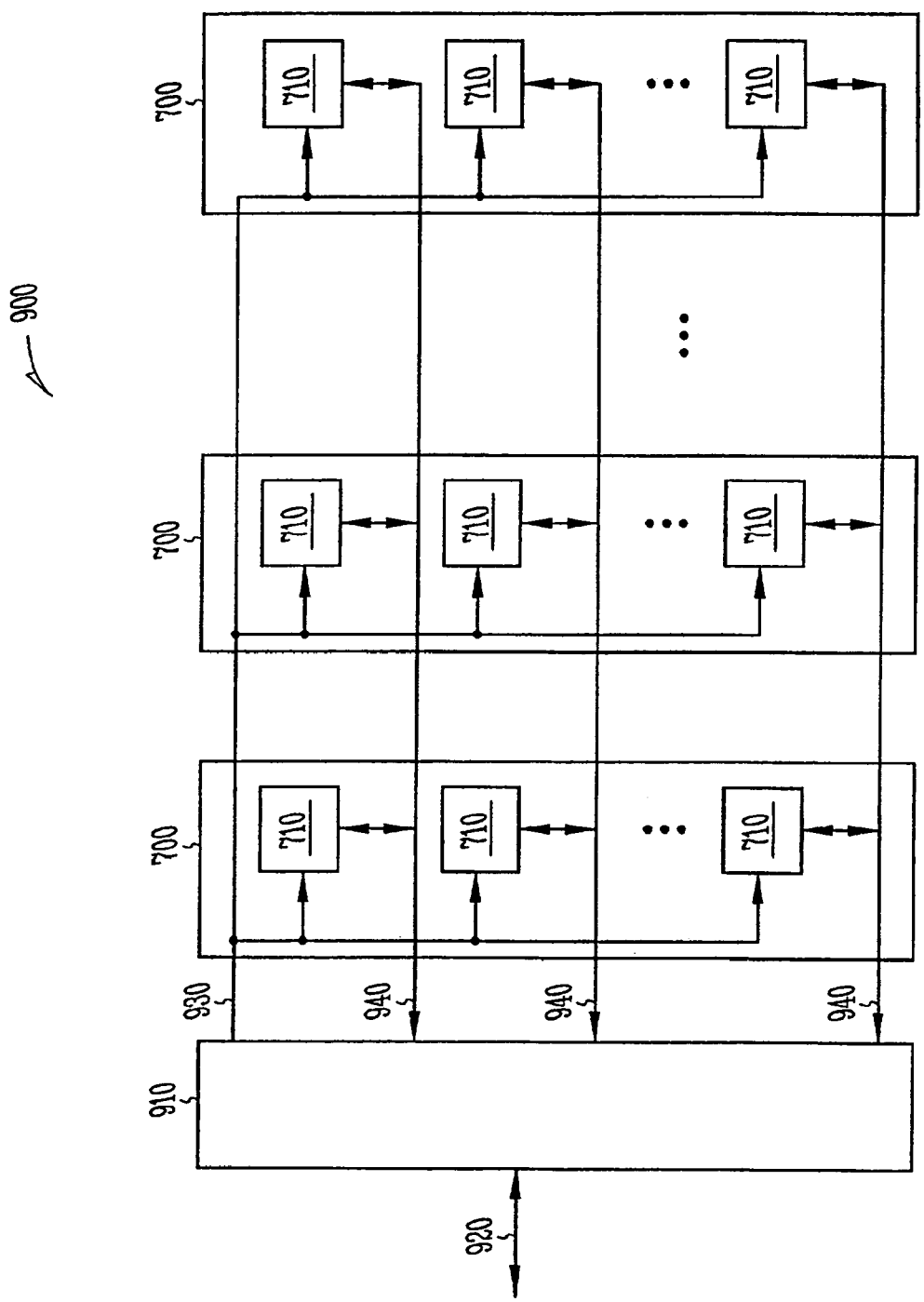
FIG. 9 is a block schematic diagram of a memory system in accordance with an embodiment of the present invention.

FIG. 9 shows one embodiment of an electronic system as memory system 900. Memory system 900 contains one or more memory modules 700 as described above including the memory system 400 and electrode structure 100C or memory cells 200D and 300E in accordance with the present invention and a memory controller 910. Memory controller 910 provides and controls a bidirectional interface between memory system 900 and an external system bus 920. Memory system 900 accepts a command signal from the external bus 920 and relays it to the one or more memory modules 700 on a command link 930. Memory system 900 provides for data input and data output between the one or more memory modules 700 and external system bus 920 on data links 940.

Figure 10:
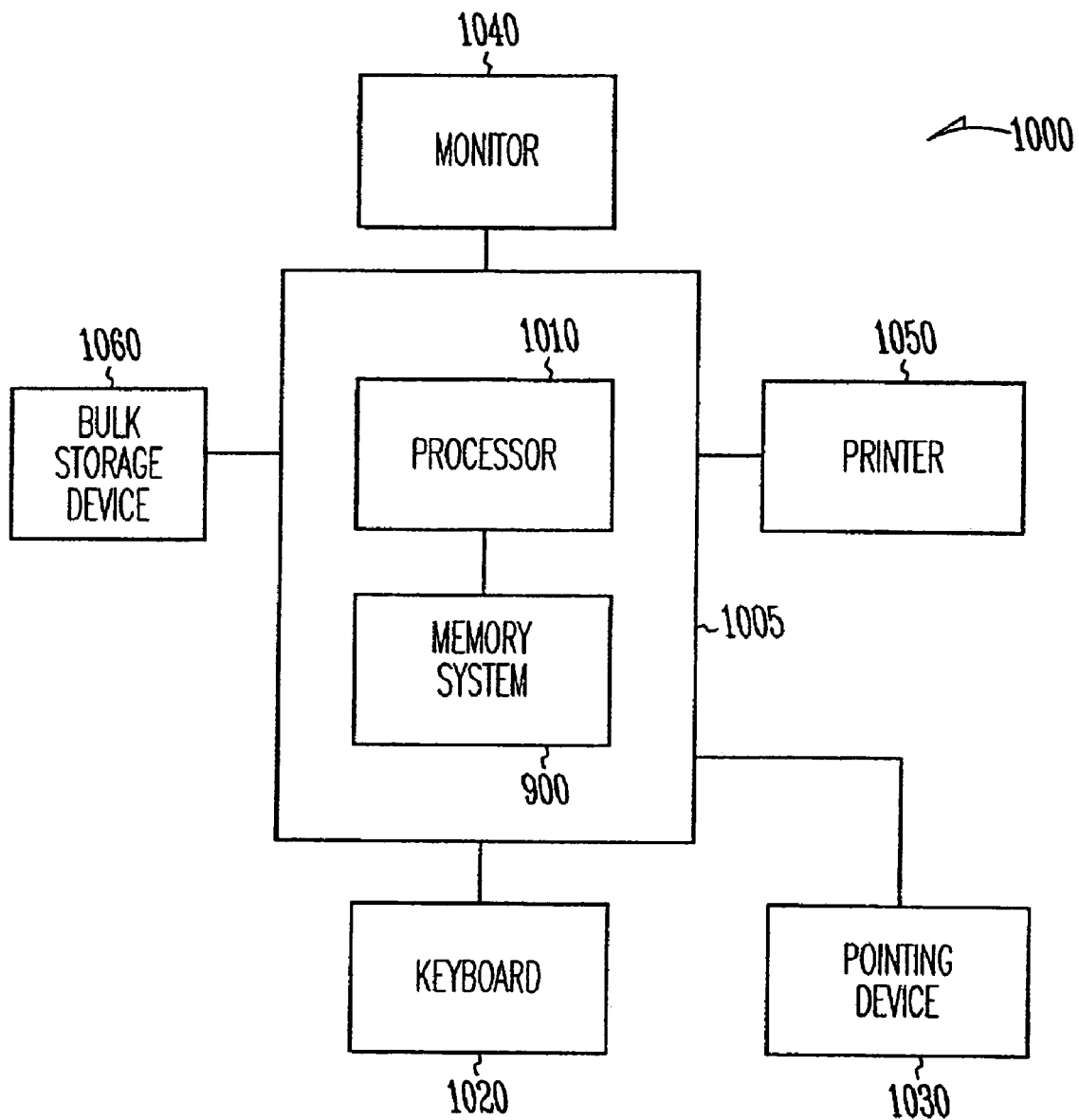
FIG. 10 is a block schematic diagram of a computer system in accordance with an embodiment of the present invention.

FIG. 10 shows a further embodiment of an electronic system as a computer system 1000. Computer system 1000 contains a processor 1010 and a memory system 900 housed in a computer unit 1005. Computer system 1000 is but one example of an electronic system containing another electronic system, i.e. memory system 900, as a sub-component, including the memory system 400 and electrode structure 100C or memory cells 200D and 300E in accordance with the present invention. Computer system 1000 optionally contains user interface components. Depicted in FIG. 10 are a keyboard 1020, a pointing device 1030, a monitor 1040, a printer 1050 and a bulk storage device 1060. It will be appreciated that other components are often associated with computer system 1000 such as modems, device driver cards, additional storage devices, etc. It will further be appreciated that the processor 1010 and memory system 900 of computer system 1000 can be incorporated on a single integrated circuit. Such single package processing units reduce the communication time between the processor 1010 and the memory system 900.

CONCLUSION

The present invention thus provides an electrode structure and memory cell structure and method of fabrication that provides substantially improved adhesion between two layers of conductive material during subsequent processing operations, such as a CMP operation. The electrode structure and memory cell structure of the present invention also can provide a conductive interface between the two conductive layers that is not an electrical barrier and can provide a doped glass layer that can be programmed to store data. The present invention also provides a method of fabricating an electrode structure or memory cell structure that does not adversely effect subsequent processing operations or require additional processing operations and the process can be controlled to avoid damage to other components that may already have been formed on the same wafer or substrate.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A method of making an electrode structure, comprising:
   forming a first layer of conductive material;
   forming a dielectric layer on a surface of the first layer;
   forming an opening in the dielectric layer to expose a portion of the surface of the first layer;
   forming an oxide binding layer over the dielectric layer and over the exposed portion of the surface of the first layer, wherein the oxide binding layer being made conductive or at least semi-conductive; and
   forming a second layer of conductive material on the oxide binding layer.

2. The method of claim 1, wherein forming the oxide binding layer comprises forming an oxide layer; and annealing the electrode structure to cause conductive material from the second layer to be chemisorbed into the oxide layer.

3. The method of claim 2, further comprising controlling the chemisorption of conductive material from the second layer into the oxide layer by annealing at a selected temperature for a predetermined time period.

4. The method of claim 1, further comprising selecting a metal that is diffusible into an oxide for the second layer of material.

5. The method of claim 1, further comprising planarizing the electrode structure by a chemical/mechanical planarization process.

6. A method of making an electrode structure, comprising:
   forming a first layer of metallization;
   forming a dielectric layer on a surface of the first layer;
   forming an opening in the dielectric layer to expose a portion of the surface of the first layer;
   forming an oxide binding layer over the dielectric layer and over the exposed portion of the surface of the first layer, wherein the oxide binding layer being made conductive or at least semi-conductive;
   forming a second layer of metallization on the oxide binding layer;
   annealing the electrode structure to cause metallization from the second layer to diffuse into the binding layer and to provide adhesion between the first and second layers of metallization; and
   planarizing the electrode structure by a chemical/mechanical planarization process to form an isolated metallization structure formed in the opening in the dielectric layer.

7. A method of making an electrode structure, comprising:
   forming a first layer including one of tungsten, nickel and polysilicon;
   forming a dielectric layer on a surface of the first layer;

forming an opening in the dielectric layer to expose a portion of the surface of the first layer;
forming a binding layer including a silicon dioxide on the dielectric layer and on the exposed portion of the surface of the first layer;
forming a second layer including one of silver and nickel on the binding layer;
annealing the electrode structure at a selected temperature for a predetermined time period to control the chemisorption of silver or nickel into the binding layer, wherein the binding layer is made capable of conducting electrical current; and
planarizing the electrode structure to form a damascene silver layer in the opening.

8. A method of making an electrode structure, comprising:
forming a first layer of conductive material;
forming a dielectric layer on a surface of the first layer;
forming an opening including a reentrant profile in the dielectric layer to expose a portion of the surface of the first layer;
forming a conductive binding layer on the dielectric layer and on the exposed portion of the surface of the first layer; and
forming a second layer of conductive material on the conductive binding layer.

9. A method of making an electrode structure, comprising:
forming a first layer including one of tungsten, nickel and polysilicon;
forming a first dielectric layer on a surface of the first layer;
forming a second dielectric layer on the first dielectric layer, wherein the first dielectric layer has an etch rate faster than the second dielectric layer;
forming an opening in the first and second dielectric layers to expose a portion of the surface of the first layer, wherein the opening includes a reentrant profile in response to a difference in the etch rate between the first and second dielectric layers;
forming a binding layer including a silicon dioxide on the second dielectric layer and on the exposed portion of the surface of the first layer;
forming a second layer including one of silver and nickel on the binding layer;
annealing the electrode structure at a selected temperature for a predetermined time period to control the chemisorption of silver or nickel into the binding layer; and
planarizing the electrode structure to form a damascene silver layer in the opening.

10. A method of making a semiconductor die, comprising:
providing a substrate;
forming an integrated circuit supported by the substrate; and
forming an electrode coupled to the integrated circuit, wherein forming the electrode includes:
forming a first layer of conductive material;
forming a dielectric layer on a surface of the first layer;
forming an opening in the dielectric layer to expose a portion of the surface of the first layer;
forming a conductive binding layer over the dielectric layer and over the exposed portion of the surface of the firs layer, wherein the conductive binding layer is formed from an annealed insulating material; and
forming a second layer of conductive material over the conductive binding layer.

11. A method of making a semiconductor die, comprising:
providing a substrate;
forming an integrated circuit supported by the substrate; and
forming an electrode structure associated with the integrated circuit, wherein
forming the electrode structure includes:
forming a first layer of metallization;
forming a dielectric layer on a surface of the first layer;
forming an opening in the dielectric layer to expose a portion of the surface of the first layer;
forming an oxide binding layer on the dielectric layer and on the exposed portion of the surface of the first layer;
forming a second layer of metallization on the binding layer;
annealing the electrode structure to cause metallization from the second layer to diffuse into the oxide binding layer and to provide adhesion between the first and second layers of metallization, wherein the oxide binding layer is made conductive or at least semi-conductive; and
planarizing the electrode structure by a chemical/mechanical planarization process to form an isolated metallization structure formed in the opening in the dielectric layer.

12. A method of making a semiconductor die, comprising:
providing a substrate;
forming an integrated circuit supported by the substrate; and
forming an electrode structure associated with the integrated circuit, wherein forming the electrode structure includes:
forming a first layer including one of tungsten, nickel and polysilicon;
forming a dielectric layer on a surface of the first layer;
forming an opening in the dielectric layer to expose a portion of the surface of the first layer;
forming an oxide binding layer including a silicon dioxide on the dielectric layer and on the exposed portion of the surface of the first layer;
a second layer including one of silver and nickel on the binding layer;
annealing the electrode structure at a selected temperature for a predetermined time period to control the chemisorption of silver or nickel into the oxide binding layer, wherein the oxide binding layer is made conductive or at least semi-conductive; and
planarizing the electrode structure to form a damascene silver layer in the opening.

13. A method of making a semiconductor die, comprising:
providing a substrate;
forming an integrated circuit supported by the substrate; and
forming an electrode coupled to the integrated circuit, wherein forming the electrode includes:
forming a first layer of conductive material;
forming an oxide binding layer on a surface of said first layer, wherein the oxide binding layer being made conductive or at least semiconductive; and
forming a second layer of conductive material on the binding layer.

14. The method of making a semiconductor die of claim 13, wherein said second layer of conductive material is a metal layer and said oxide binding layer comprises an oxide layer and metal from said second layer diffused into said oxide layer.

* * * * *

UNITED STATES PATENT AND TRADEMARK OFFICE
CERTIFICATE OF CORRECTION

PATENT NO. : 7,115,504 B2
APPLICATION NO. : 10/873230
DATED : October 3, 2006
INVENTOR(S) : John T. Moore et al.

It is certified that error appears in the above-identified patent and that said Letters Patent is hereby corrected as shown below:

On Title Page, Item (56)
　　In the Other Publications portion of the Refernces Cited section, the following errors are corrected:

"Boolchand, P.; Grotaus, J.; Phillips, J.C., Broken chemical order and phase separation in $Ge_xSe_{1-x}$ glasses, Solid State Comm. 45 (1983) 183-185."

Should read

--Boolchand, P.; Grothaus, J.; Phillips, J.C., Broken chemical order and phase separation in $Ge_xSe_{1-x}$ glasses, Solid State Comm. 45 (1983) 183-185.--; and "Dearnaly, G.; Stoneham, A.M.; Morgan, D.V., Electrical phenomena in amorphous oxide films, Rep. Prog. Phys. 33 (1970) 1129-1191."

Should read

--Dearnaley, G.; Stoneham, A.M.; Morgan, D.V., Electrical phenomena in amorphous oxide films, Rep. Prog. Phys. 33 (1970) 1129-1191.--.

Signed and Sealed this

Twenty-sixth Day of December, 2006

JON W. DUDAS
*Director of the United States Patent and Trademark Office*